(12) United States Patent
Behfar et al.

(10) Patent No.: US 7,830,939 B2
(45) Date of Patent: Nov. 9, 2010

(54) LOW COST INGAAIN BASED LASERS (75) Inventors: Alex A. Behfar, Irvine, CA (US);
Wilfried Lenth, Santa Cruz, CA (US)

(73) Assignee: BinOptics Corporation, Ithaca, NY (US)

( * ) Notice: Subject to any disclaimer, the term of this patent is extended or adjusted under 35 U.S.C. 154(b) by 41 days.

(21) Appl. No.: 12/171,286

(22) Filed: Jul. 10, 2008

(65) Prior Publication Data
US 2008/0298413 A1    Dec. 4, 2008

Related U.S. Application Data

(62) Division of application No. 11/509,015, filed on Aug. 24, 2006, now Pat. No. 7,408,183.

(60) Provisional application No. 60/710,882, filed on Aug. 25, 2005.

(51) Int. Cl.
*H01S 5/00* (2006.01)
*H01L 31/00* (2006.01)
*H01L 29/20* (2006.01)

(52) U.S. Cl. .............................. 372/45.011; 372/49.01; 257/22; 257/615

(58) Field of Classification Search ............ 372/45.011, 372/49.01; 257/22, 615, E33.033, E33.069; 438/33, 39, 42, 47
See application file for complete search history.

(56) References Cited

U.S. PATENT DOCUMENTS

| | | | | |
|---|---|---|---|---|
| 6,611,544 | B1 * | 8/2003 | Jiang et al. | 372/50.11 |
| 2002/0013925 | A1 * | 1/2002 | Senshu | 714/769 |
| 2003/0136957 | A1 * | 7/2003 | Tsuda et al. | 257/14 |
| 2004/0245535 | A1 * | 12/2004 | D'Evelyn et al. | 257/94 |
| 2006/0038166 | A1 * | 2/2006 | Tsuda et al. | 257/13 |

* cited by examiner

*Primary Examiner*—Minsun Harvey
*Assistant Examiner*—Patrick Stafford
(74) *Attorney, Agent, or Firm*—Jones, Tullar & Cooper, P.C.

(57) ABSTRACT

A method and structure for producing lasers having good optical wavefront characteristics, such as are needed for optical storage includes providing a laser wherein an output beam emerging from the laser front facet is essentially unobstructed by the edges of the semiconductor chip in order to prevent detrimental beam distortions. The semiconductor laser structure is epitaxially grown on a substrate with at least a lower cladding layer, an active layer, an upper cladding layer, and a contact layer. Dry etching through a lithographically defined mask produces a laser mesa of length $l_c$ and width $b_m$. Another sequence of lithography and etching is used to form a ridge structure with width w on top of the mesa. The etching step also forming mirrors, or facets, on the ends of the laser waveguide structures. The length $l_s$ and width $b_s$ of the chip can be selected as convenient values equal to or longer than the waveguide length $l_c$ and mesa width $b_m$, respectively. The waveguide length and width are selected so that for a given defect density D, the yield $Y_D$ is larger than 50%.

18 Claims, 9 Drawing Sheets

LOW COST INGAAIN BASED LASERS

CROSS REFERENCE TO RELATED APPLICATIONS

This application is a divisional under 35 U.S.C. 120 of U.S. application Ser. No. 11/509,015, filed Aug. 24, 2006, now U.S. Pat. No. 7,408,183, which claims the benefit under 35 U.S.C. 119(e) of U.S. Provisional Application No. 60/710,882, filed Aug. 25, 2005, the disclosure of which is incorporated herein by reference.

FIELD OF THE INVENTION

The present invention relates to semiconductor diode lasers and, more specifically, to low-cost InGaAlN based lasers with etched facets.

BACKGROUND OF THE INVENTION

InGaAlN diode lasers are of interest as light sources for a number of applications; for example, in high-density optical storage, displays, printing and biomedicine. In many devices and systems associated with these applications, laser sources are needed that are capable of providing an output beam with high wavefront quality. Furthermore, the widespread use and commercial success of many of these systems and devices depend on the ability to provide them at low cost. Consequently, high manufacturing yields and low cost are critical requirements for the light sources needed to construct such systems and devices.

Semiconductor diode lasers based on epitaxially grown layers of at least an n-type lower cladding layer, an undoped active layer with quantum wells and barriers, a p-type upper cladding layer, and a highly p-type doped contact layer, have been fabricated from $In_xGa_yAl_zN$, where $0<=x<=1$, $0<=y<=1$, $0<=z<=1$, and $x+y+z=1$. These lasers are able to emit in a range of wavelengths that span at least from violet to blue-green wavelengths. Lasers of this type have been fabricated and described in the prior art, see for example, S Nakamura, et al., "The Blue Laser Diode: The Complete Story", Springer-Verlag, 2000, but such lasers face many challenges in meeting the requirements of high manufacturing yield and low cost, high reliability, and high optical quality of the output radiation.

The substrate materials that are currently available for the epitaxial growth of InGaAlN-based laser-active layers lead to unique problems which present substantial obstacles to achieving high manufacturing yield and low cost. For example, available substrates cause unusually high defect densities in the laser-active material layers and, in addition, make it very challenging, if not impossible, to use mechanical cleaving for the formation of laser mirrors due to the mechanical properties of the substrate material. Substrates made of SiC and Sapphire have been used for the fabrication of InGaAlN lasers, but these materials do not permit lattice-matched growth of the InGaAlN layers, and result in very high defect densities, low manufacturing yield and reliability concerns. Recently, freestanding GaN substrates have become available for use in the fabrication of GaN lasers, as described in United States Patent Application Publication No. US 2003/0145783 A1 of Kensaku Motoki, et al, published Aug. 7, 2003. However, even when the highest-quality GaN substrates are used, the laser active layers exhibit a defect density of around $10^5$ cm$^{-2}$, which is several orders of magnitude higher than for typical commercial semiconductor lasers based on other material systems. Furthermore, the size of these GaN substrates is currently limited to diameters of 2 inches, at most, and the cost is very high. If a low cost is to be achieved, it is important to limit the impact of the defect density on the laser fabrication yield so as significantly to improve yield.

It is known that mirror facets can be formed on diode lasers by etching techniques, as described in U.S. Pat. No. 4,851,368, and in Behfar-Rad, et al, *IEEE Journal of Quantum Electronics*, volume 28, pages 1227-1231, 1992, the disclosures of which are incorporated herein by reference. However, early work in etching GaN mirror facets did not result in high-quality facets. For example, etched surfaces that were desired to be perpendicular to the substrate turned out at an angle from the vertical, as described in Adesida, et al, *Applied Physics Letters*, volume 65, pages 889-891, 1994, and the facets were too rough, resulting in poor reflectivity, as described in Stocker, et al, *Applied Physics Letters*, volume 73, pages 1925-1927, 1998.

Recently, a novel process that allows high quality mirror facets to be formed in a GaN material system has been described in U.S. application Ser. No. 11/455,636, to Behfar et al, filed Jun. 20, 2006, and assigned to the assignee of the present application, the disclosure of which is incorporated herein by reference. As described in that application, it is very difficult to form multiple lasers of short cavity length on a wafer through the use of conventional cleaving techniques because of the mechanical handling that is involved in the cleaving operation. In addition, cleaving results in the simultaneous formation of mirror facets and the singulation of the wafer substrate into separate laser chips. Successful formation of cleaved facets is particularly difficult for InGaAlN based lasers grown on GaN substrates, since the cleaving of GaN crystals is more challenging than cleaving of the GaAs and InP substrates previously used for the mass-produced diode lasers utilized for CD, DVD and telecommunications.

On the other hand, use of the etching process described in application Ser. No. 11/455,636 for the formation of laser facets permits optimization of the facet formation independently of the subsequent device singulation. In this process, lasers are fabricated on a wafer in much the same way that integrated circuit chips are fabricated on silicon, so that the chips are formed in full-wafer form. The laser mirrors are etched on the wafer using etched facet technology (EFT), and the electrical contacts are fabricated on the lasers. The lasers are tested on the wafer, and thereafter the wafer is singulated to separate the lasers for packaging. Scanning Electron Microscope images of etched AlGaInN-based facets show that a high degree of verticality and smoothness can be achieved using the EFT process, which also allows lasers and integrated devices to be fabricated for a variety of applications having wavelength requirements accessible with AlGaInN-based materials.

The foregoing process for fabricating lasers can be summarized as comprising the steps of lithographically defining a multiplicity of waveguide devices on a wafer having an AlGaInN-based structure and etching through the resulting mask to fabricate a multiplicity of laser waveguide cavities on the wafer. Another lithographic step followed by etching is used to form laser facets, or mirrors, on the ends of the waveguides while they are still on the wafer. Thereafter, electrical contacts are formed on the laser cavities, the individual lasers are tested on the wafer, and the wafer is singulated to separate the lasers for packaging. This method of etching the facets includes using a high temperature stable mask on a p-doped cap layer of the AlGaInN-based laser waveguide structures on the wafer to define the locations of the facets, with the mask maintaining the conductivity of the cap layer, and then etching the facets in the laser structure through the mask using a temperature over 500° C. and an ion beam voltage in excess of 500V in CAIBE.

Selectivity between the etching of the semiconductor and the masking material is very important in obtaining straight surfaces for use in photonics. High selectivity between the mask and the GaN based substrate is obtained by performing CAIBE at high temperatures. Large ion beam voltages in CAIBE were also found to enhance the selectivity. The mask materials were chosen to withstand the high temperature etching, but also to prevent damage to the p-contact of the GaN-based structure.

Particularly in the case of InGaAlN lasers, etching of the laser mirrors can offer a number of important advantages for improving yield and reducing cost. For example:

(a) The laser cavity waveguide dimensions can be different from the chip length dimension and can be optimized to maximize the laser fabrication yield. By fabricating a waveguide of limited length, the probability of a material defect occurring in the laser active region is reduced and the fabrication yield is increased.

(b) Redundant lasers can be fabricated on one semiconductor chip to produce yield and reliability improvements.

(c) Surface emitting lasers with the laser cavity oriented horizontally in the wafer plane can be fabricated by etching a 45° surface to direct the radiation upward out of the wafer plane.

(d) Laser facet coatings for desirable reflectivity modifications can be applied at the full wafer level prior to device separation.

(e) Laser testing can be carried out economically at the full-wafer level.

(f) Additional components such as photodiodes, lenses and gratings can be monolithically integrated with the lasers.

The yield and cost of today's mass-produced diode lasers based on GaAs and InP substrates are not impacted by the substrate quality and cost. Substrates for these laser devices typically have defect densities of about $10^2$ cm$^{-2}$ and are available in wafers of larger sizes of up to 6 inches in diameter at a cost that is several orders of magnitude lower than that of GaN substrates. Both GaAs and InP have a zinc blend crystal structure that facilitates the use of cleaving for both the formation of the laser end mirrors and the chip singulation, and cleaving is the primary method used in volume production of these semiconductor lasers. In addition, in diode laser applications in areas such as telecommunications optical imaging is not a primary concern and the requirements on optical beam quality are more relaxed.

What is needed in order to produce InGaAlN lasers with high yield, low cost, high reliability and good wavefront quality is a device design that minimizes the occurrence of substrate-induced defects in and near the laser-active region, and provides an undistorted optical beam and a method for fabricating such a laser device.

SUMMARY OF THE INVENTION

According to the present invention, an InGaAlN semiconductor diode laser is provided with laser mirrors formed by etching. The laser incorporates special design features that decrease undesirable yield loss caused by substrate defects, provide lower device cost, improve reliability, and provide an output beam with high optical wavefront quality. It has been shown in the prior art that mirror or facet etching permits the fabrication of waveguide lengths as short as 3 micron. Additional advantages offered by laser facet etching, such as full-wafer testing and device integration have also been described in the prior art. However, the need for special choices of laser waveguide length and width to minimize yield reductions caused by material defects has not been recognized in the art, nor has the need for a specific geometry for providing laser light of high optical wavefront quality been recognized.

Briefly, and in accordance with the present invention, a method and structure for producing lasers having good optical wavefront characteristics, such as are needed for optical storage, are provided. For these purposes, the geometry at and near the etched front facet of the laser is designed in such a way that an output beam emerging from the laser front facet is essentially unobstructed by the edges of the semiconductor chip in order to prevent detrimental beam distortions. This requirement is in contrast to diode laser applications in other areas, such as telecommunications, where optical imaging is not a primary concern and the requirements on optical beam quality are more relaxed.

In accordance with one aspect of the invention, a semiconductor laser structure is epitaxially grown on a substrate with at least a lower cladding layer, an active layer, an upper cladding layer, and a contact layer. Dry etching through a lithographically defined mask produces a laser mesa of length $l_c$ and width $b_m$. Another sequence of lithography and etching is used to form a ridge structure with width w on top of the mesa in a preferred form of the invention, although it is understood that this invention is not limited to ridge laser structures, the etching step also forming mirrors, or facets, on the ends of the laser waveguide structures.

The wafer is separated into single device chips using an appropriate singulation process, such as sawing, cleaving after scribing, or laser-based dicing. The length $l_s$ and width $b_s$ of the chip can be selected as convenient values equal to or longer than the waveguide length $l_c$ and mesa width $b_m$, respectively.

Because etching is used for the formation of the laser mirrors, the laser waveguide can be designed such that it is shorter than the length of the device chip and, specifically, a design can be chosen that reduces the yield loss caused by the unusually high defect density normally encountered in the active layers of InGaAlN lasers. The probability of a material defect being located within the laser-active waveguide region is related to its length $l_c$ and effective intensity profile width $w_I$, and the defect density D. The yield $Y_D$ for fabricating lasers without such a defect is inversely proportional to this probability and can be expressed using Poisson statistics. In accordance with the invention, the waveguide length and width are selected so that for a given defect density D, the yield $Y_D$ is larger than 50%.

Particularly for applications requiring laser light with high optical wavefront quality, it is important to design the geometry for the laser mirror, mesa and device chip in such a way that the laser output can emerge and propagate without significant obstruction by the chip edge. Therefore, it is desirable to create the front face of the device chip at a very small distance a from the front of the laser mesa from which the laser beam emerges. At the same time, singulation must be carried out not too close to the high-quality mirror surface in order to avoid damage. Since the dimensional accuracy of singulation is typically much reduced compared to the lithographically controlled etching processes, it is desirable to choose a length $l_s$ of the device chip that is longer than the length $l_c$ of the laser mesa and to position the waveguide such that a is small but not zero.

According to the present invention, the distance a between the edge of the chip and the bottom of the laser mesa and the height h between the center of the laser output beam and the top of the laser mesa must be chosen with particular attention to the beam divergence of the laser radiation emitted from the front laser mirror. In the direction perpendicular to the substrate, the radiation emerging from the front laser mirror has high intensity in the beam center and falls off over an extended distance away from the beam center. The vertical divergence of the emitted laser beam is typically characterized by its full-width-half-maximum farfield angle θ marking the angular spread between the rays where the intensity is reduced to 50% of its center value. The edge of the device chip can cause a partial obstruction of the lower part of the propagating laser beam. If this occurs, some of the light impinging onto the top surface will be reflected and interfere with the upper part of the laser beam and, together with the diffraction caused by the chip edge, can result in undesirable distortions of the radiation profile and spatially varying modulation of the laser intensity. For applications requiring high optical wavefront quality, it is important to minimize the obstruction of the laser light by the chip edge formed through the singulation process.

BRIEF DESCRIPTION OF DRAWINGS

The foregoing and additional objects, features and advantages of the invention will become apparent to those of skill in the art from the following detailed description of the invention taken with the accompanying drawings, which are briefly described as follows.

DESCRIPTION OF PREFERRED EMBODIMENTS

Figures 1A, 1B, 1C:
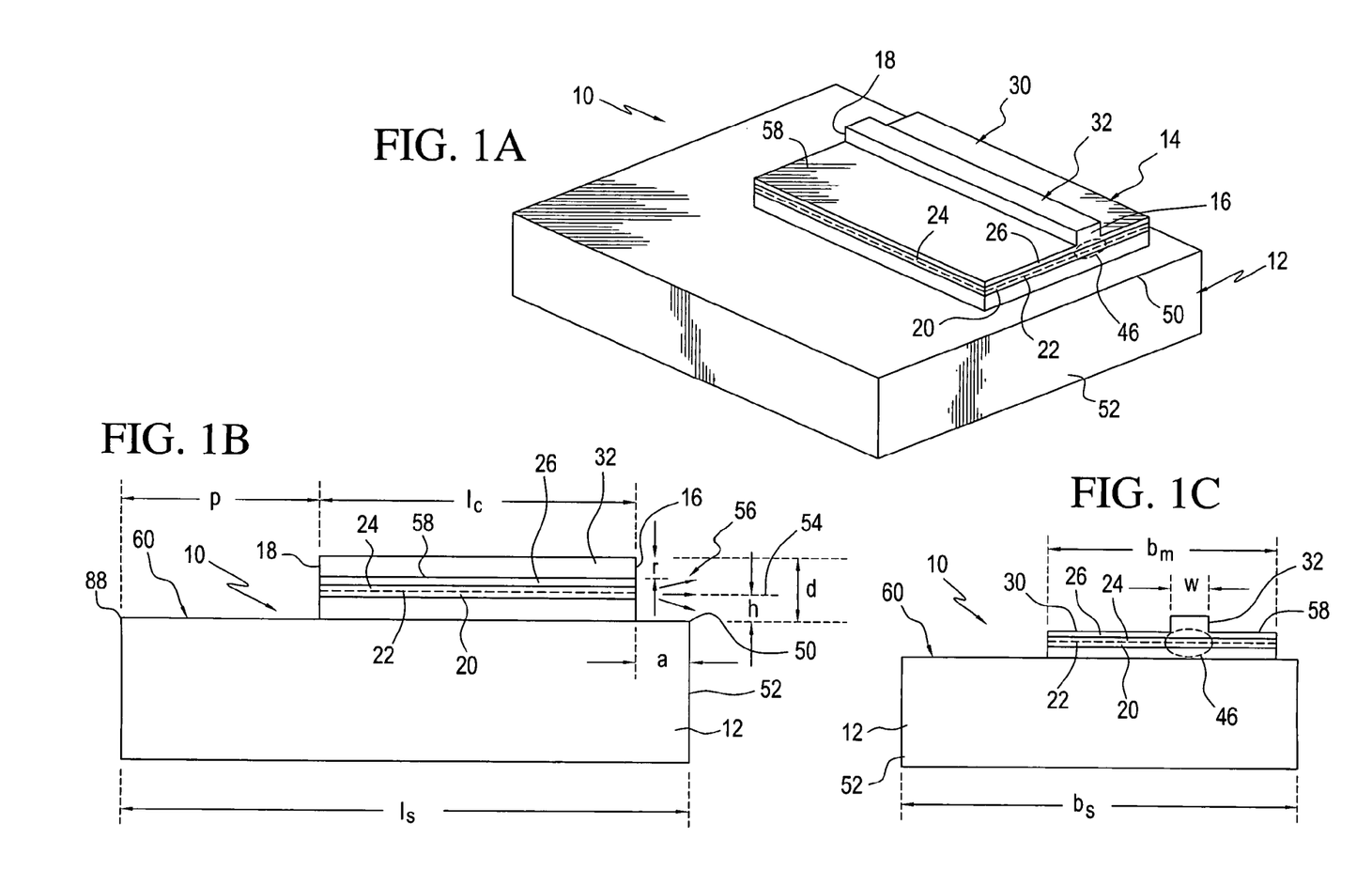
FIG. 1A illustrates a singulated ridge-type semiconductor laser with etched facets perpendicular to the plane of the substrate.
FIG. 1B illustrates a cross section of a singulated ridge-type laser in the direction along the laser waveguide.
FIG. 1C illustrates a cross section of a singulated ridge-type laser in a direction perpendicular to the laser waveguide direction.

Turning now to a detailed description of the invention, FIGS. 1A-1C illustrate a diode laser chip 10, including a substrate 12 supporting an epitaxially grown and etched ridge laser 14 having end facets 16 and 18. The ridge laser is formed by etching of the laser end facets, as is known in the art, with the present laser having a special design geometry. In accordance with the invention, the semiconductor laser structure 14 is epitaxially grown on substrate 12 with at least a lower cladding layer 20, an active layer 22, an upper cladding layer 24, and a contact layer 26. Dry etching through a lithographically defined mask produces a laser mesa 30 of length $l_c$ and width $b_m$. Another sequence of lithography and etching is used to form the ridge structure 32 with width w on top of the mesa. While the laser schematically shown in FIGS. 1A-C and described above is a ridge-type design, it is understood that this invention is not limited to ridge laser structures and also applies to other semiconductor laser designs.

Figure 2:
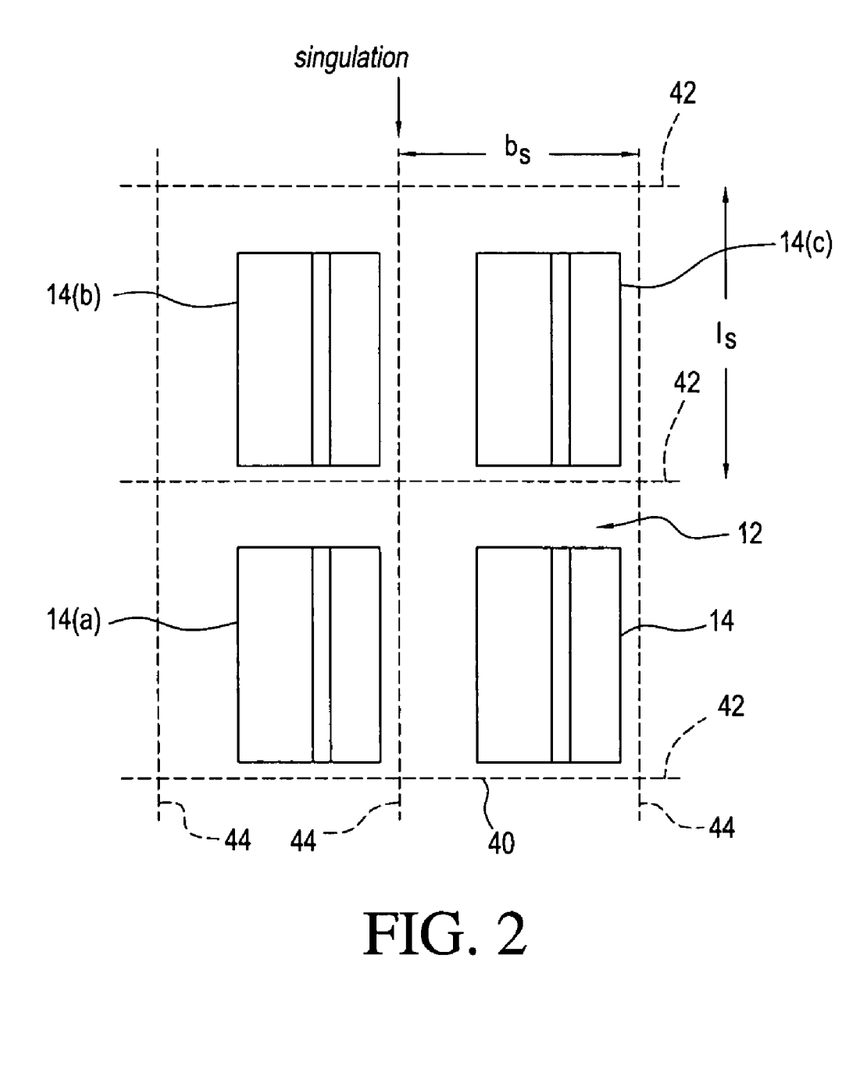
FIG. 2 illustrates a top view of a section of a laser wafer prior to separation into individual devices.

As illustrated in FIG. 2, the substrate 12 may be in the form of a conventional wafer 40 on which is fabricated, by known masking and etching steps, multiple lasers 14, 14(a), 14(b), 14(c) . . . 14(n). After formation and testing of these lasers, the wafer is separated into multiple single device chips 12, 12(a), 12(b), 12(c) . . . 12(n), using an appropriate singulation process, such as sawing, cleaving after scribing, or laser-based dicing along horizontal and vertical cleaving lines 42 and 44. The length $l_s$ and width $b_s$ of each chip can be selected to have convenient values equal to or longer than the waveguide length $l_c$ and mesa width $b_m$, respectively, of each corresponding laser 14.

By using an etching process for the formation of the laser and mirrors or facets, such as facets 16 and 18, each laser waveguide can be designed to be shorter than the length of the corresponding chips device. Specifically, a design can be chosen that reduces the yield loss caused by the unusually high defect density found in the active layers of InGaAlN lasers. The probability of a material defect being located within a laser-active waveguide region 46, such as that illustrated in FIGS. 1A and 1C, is related to the length $l_c$ and effective intensity profile width $w_l$, of that region, and the defect density D. The yield $Y_D$ for fabricating lasers without such a defect is inversely proportional to this probability and can be expressed using Poisson statistics:

$$Y_D = \exp(-D \ast w_l \ast l_c) \qquad (1)$$

Although the yield is discussed herein below in terms of fabricating InGaAlN lasers without any defects, it will be understood that it may be possible to have a InGaAlN laser with a defect or defects in the cavity that may function adequately for a particular application. However, reducing the defects in an InGaAlN laser in or near the active region 46 has positive implications for laser yield and reliability.

The laser intensity profile in a direction perpendicular to the longitudinal axis, or direction, of a laser waveguide 14, and in the plane of the substrate 12, is high in the center and falls off to the sides. Typically, the laser intensity profile can adequately be described by a Gaussian distribution. For practical purposes $w_l$ is defined here as the width between the points where the intensity is reduced to $1/e^3$ of its center value.

Figure 3:
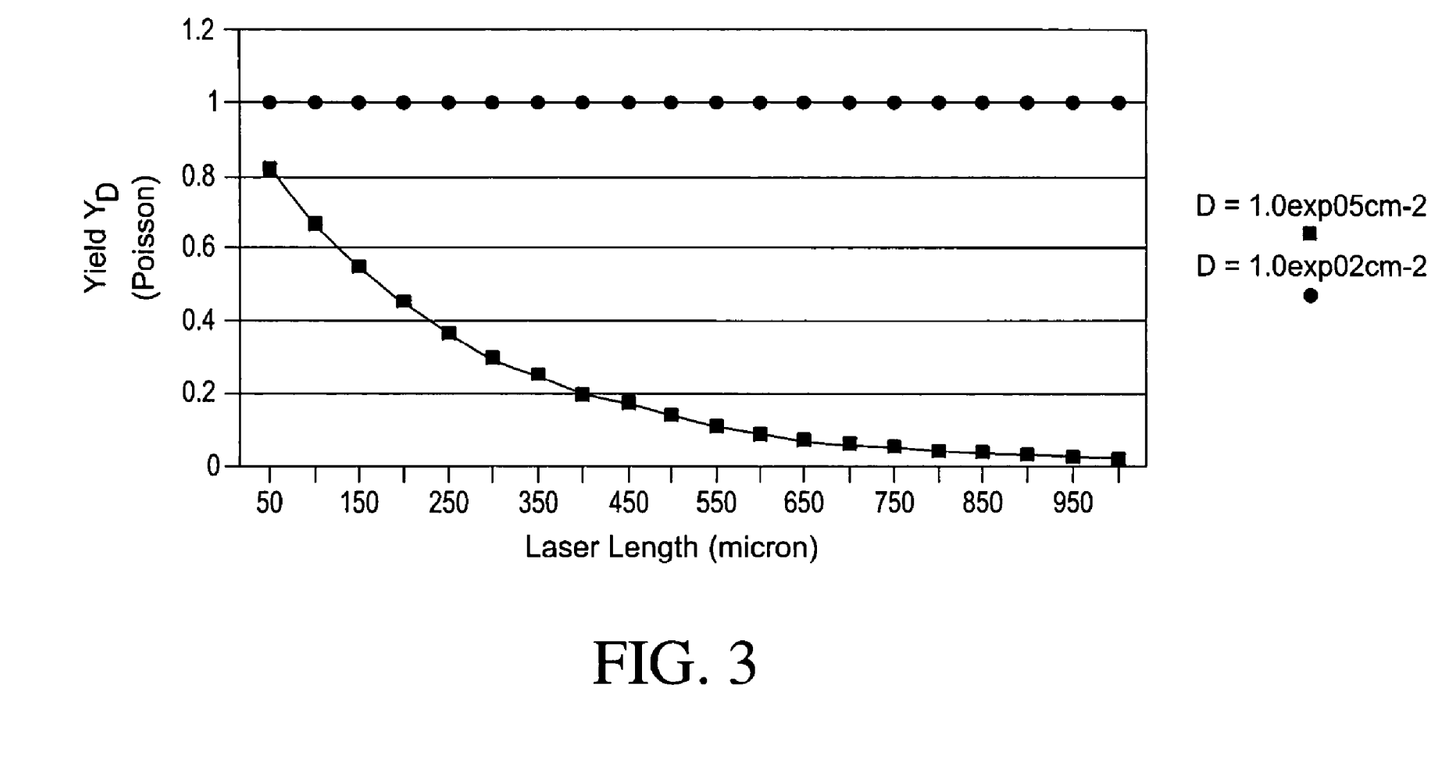
FIG. 3 shows the laser yield as a function of the laser waveguide length $l_c$, wherein an effective width $w_l$ of 4 microns was used for the calculation and yield curves for two different defect densities of $D=10^5$ cm$^{-2}$, the lowest defect density reported for InGaAlN diode lasers, and $D=10^2$ cm$^{-2}$, a typical value for mass produced AlGaAs lasers, are shown.

It is noted that other effects will impact the total manufacturing yield Y while $Y_D$ describes only the yield impact caused by material defects of density D. FIG. 3 shows $Y_D$ as a function of $l_c$ for $D=10^5$ cm$^{-2}$ and a width of $w_f=4$ micron. Yield values for laser lengths up to 1000 micron, as typically used for semiconductor diode lasers, are shown. FIG. 3 clearly illustrates that an InGaAlN diode laser with a length of 100 micron can be fabricated with a yield $Y_D$ that is more than 5 times higher than that for InGaAlN lasers with the typically used length of 500 micron.

FIG. 3 also illustrates typical values of $Y_D$ for mass-produced 780-nm lasers made of essentially $Al_{1-x}Ga_xAs$ material layers, which exhibit defect densities less than $10^2$ cm$^{-2}$. In the case of InGaAlN lasers, substrate defects cause substantial yield degradation with increasing laser length $l_c$, whereas for 780-nm lasers they do not. Therefore, the design constraints implied by Eq. (1) do not have to be considered in the case of AlGaAs lasers, whereas they lead to substantial yield improvements for InGaAlN lasers.

According to the present invention, it is desirable to select the waveguide length and width such that for a given defect density $D$, $Y_D$ as determined by Eq. (1) is larger than 50%. The choice of a limited waveguide length has the additional benefit of reducing the total internal laser losses.

Particularly for applications requiring laser light with high optical wavefront quality, it is important to design the geometry for the laser mirror 16, the mesa 30 and device chip 10 in such a way that the laser output light beam from facet 16 can emerge and propagate outwardly without significant obstruction by the edge 50 of the chip 10. Therefore, it is desirable to create the front face 52 of the device chip at a very small distance a from the front facet 16 of the laser mesa 30 from which the laser beam 56 emerges (see FIGS. 1A and 1B). At the same time, the singulation of the chips must be carried out so that the cleaving lines 42 (FIG. 2) are not too close to the high-quality mirror surface 16 in order to avoid damage. Since the dimensional accuracy of singulation is typically much reduced compared to the lithographically controlled etching processes it is desirable to choose a length $l_s$ of the device chip 10 that is longer than the length $l_c$ of the laser mesa 30 and consequently of the laser waveguide 32, as illustrated in FIGS. 1A and 1B, and to position the waveguide 32 so that a is small but not zero.

Figure 4:
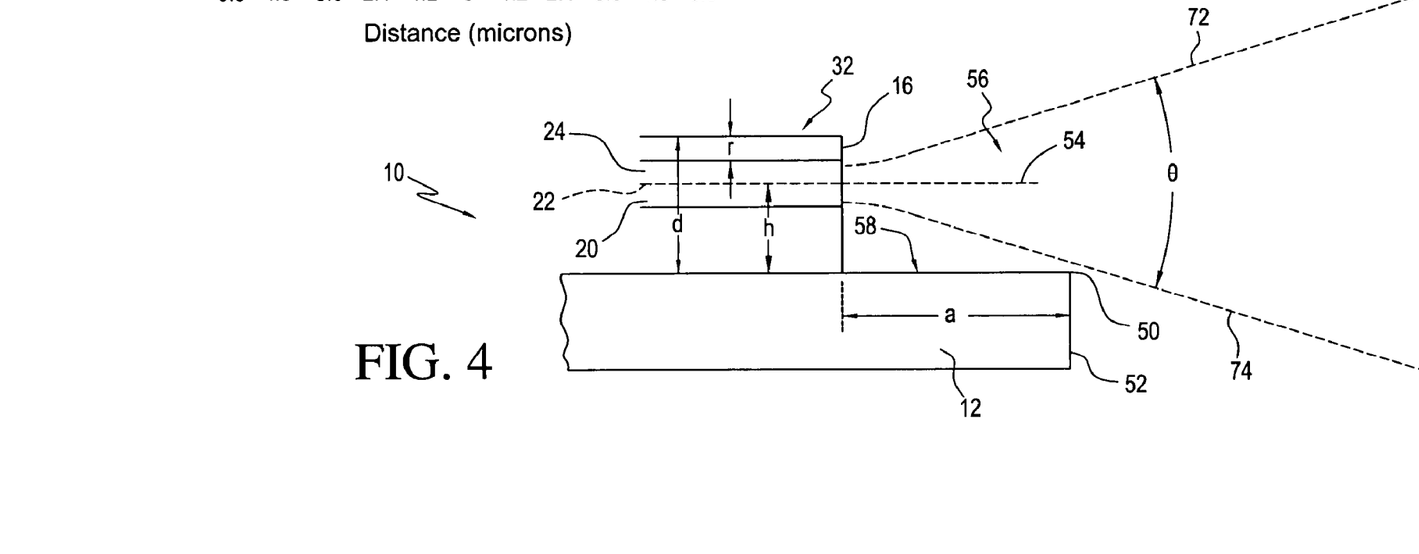
FIG. 4 illustrates the emitter end of a singulated ridge-type laser as a cross section in the direction along the laser waveguide.
Figure 5:
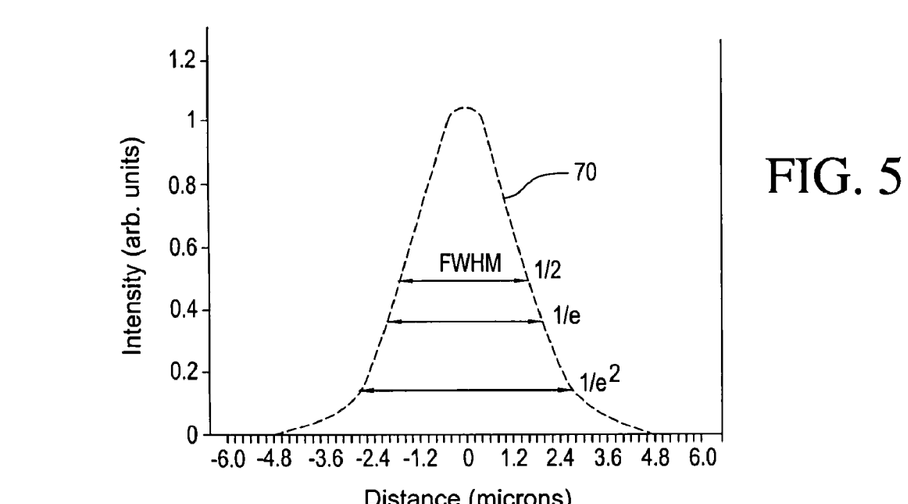
FIG. 5 illustrates a Gaussian intensity distribution of a laser beam in the direction perpendicular to the propagation direction of the beam.

According to the present invention, the distance a between the edge 50 of the chip 10 and the bottom of the laser mesa 30 and the height h between the center line 54 of the laser output beam 56 and the top 58 of the laser mesa 30 must be chosen with particular attention to the beam divergence θ of the laser radiation 56 emitted from the front laser mirror 16 (FIGS. 1B and 4). In the direction perpendicular to the top surface 60 of substrate 52, the radiation 56 emerging from the front laser mirror 16 has high intensity in the beam center 54 and falls off as a function of the distance away from the beam center. FIG. 5 illustrates a Gaussian intensity distribution curve 70, which illustrates and approximates the vertical radiation profile emitted by the laser. The vertical divergence θ of an emitted laser beam 56 is typically characterized by its full-width-half-maximum (FWHM) farfield angle, which marks the angular spread between rays having an intensity that is reduced to 50% of the center value of the beam 56. In FIG. 4, the beam boundaries 72 and 74 mark where the intensity is reduced to 50% of the maximum intensity in the center region 54, but a considerable portion of the total laser output propagates outside these boundaries. As can be understood from FIGS. 4 and 5, the edge 50 of the device chip 10 partially obstructs the lower part of the propagating laser beam 56. When this occurs, some of the light impinging onto the top surface 58 will be reflected and will interfere with the upper part of the laser beam 56 and when this effect is combined with the diffraction also caused by the chip edge, the result will be undesirable distortions of the radiation profile and spatially varying modulation of the laser intensity.

For applications requiring a high optical wavefront quality, it is important to minimize the obstruction of the laser light 56 by the chip edge 50 that is formed through the singulation process. With θ denoting the full-width-half-maximum (FWHM) far-field angle of the emitted laser radiation, a significant reduction of the beam obstruction can be obtained by configuring the geometry of the chip 10 in accordance with Equation (2):

$$\frac{h}{a} \geq \tan\left(\sqrt{\frac{2}{\ln 2}} \times \frac{\theta}{2}\right) \quad (2)$$

Assuming a true Gaussian intensity profile at the chip edge, the geometry design described by Equation (2) will reduce the laser intensity obstructed by the device chip to less than around 5%. This design can be implemented by forming the laser facets through a sufficiently deep etch and by carefully controlling the singulation process that determines the distance a.

Figures 6A, 6B:
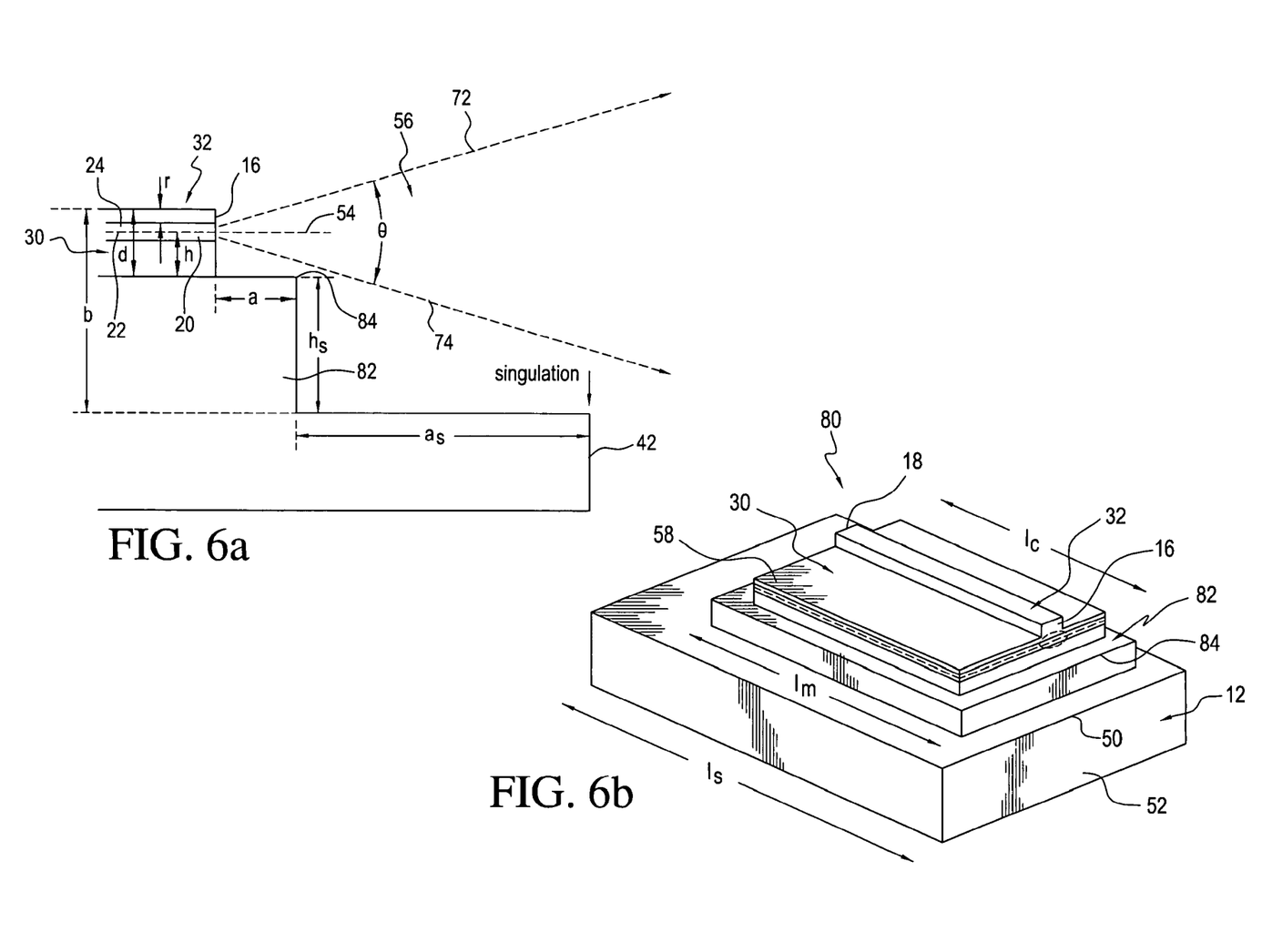
FIG. 6a illustrates the emitter end of a ridge-type laser in the direction with an auxiliary mesa as a cross section along the laser waveguide.
FIG. 6b illustrates a three-dimensional view of a device with a laser mesa of length $l_c$, an auxiliary mesa of length $l_m$ and a chip of length $l_s$ produced by singulation.

In an embodiment of the present invention, the accuracy required for dimension a can be relaxed by producing a relatively tall auxiliary mesa of length $l_m$ as illustrated in FIGS. 6a and 6b. These figures illustrate a chip device 80 fabricated on a substrate 12, in the manner described above with respect to FIGS. 1A-1C, and similar components are identified by the same numerals. The chip device 80 differs from that of FIGS. 1A to 1C in the provision of an auxiliary mesa 82 below, and supporting, mesa 30 of the prior device. A number of techniques known to those skilled in the art are available for the fabrication of such a tall mesa. These processes do not need to produce the flat and smooth high-quality surface for mesa 82 that is required for the reflective mirrors 16 and 18 at the ends of the laser waveguide. One process suitable for producing the desired structure includes photolithography to mark the position, length, and width of the auxiliary mesa 82 on top of the laser active layers 22, which are grown epitaxially on the substrate 52, as previously described. The material around the mesa boundaries is then removed to a depth of b. The laser mirrors 16 and 18 are then formed by the process referred to above, this process also defining the length $l_c$ and end positions of the laser waveguide photographically to permit precise positioning of the laser front mirror 16 relative to a forward edge 84 of the auxiliary mesa. If the distance a in FIG. 6a is chosen to be relatively small, then a relatively shallow etch depth is sufficient to assure that the ratio h/a meets the requirement of Eq. (2), thereby preventing any objectionable obstruction of the laser beam by the edge of the auxiliary mesa.

After completing the lithography and etching steps required to produce fully functional lasers on a wafer, the wafer is separated into individual devices by positioning the singulation line 42 a suitable distance $a_s$ away from the edge of the auxiliary mesa, as illustrated in FIGS. 6a and 6b. In order to avoid undesirable beam obstructions, the distance $a_s$ needs to be chosen so that:

$$\frac{h+h_s}{a+a_s} \geq \tan\left(\sqrt{\frac{2}{\ln 2}} \times \frac{\theta}{2}\right) \quad (3)$$

It is important to understand that the fabrication of the tall auxiliary mesa with height b readily leads to h+$h_s$ being large, which facilitates achieving a high ratio $(h+h_s)/(a+a_s)$ even with relatively large values for $a_s$. This relaxes the degree of accuracy required for positioning the singulation line at the front of the laser. Since common singulation methods are not photolithographically controlled the described fabrication of an auxiliary mesa can improve the manufacturing yield and reduce device cost.

Although the singulation surface has be shown to be flat in FIGS. 1A-C and FIGS. 6a-b, if a singulation surface is not used for providing optical feedback to the laser cavity, it may have roughness and be jagged without detrimental effect on laser threshold or efficiency.

The description of the laser structure has so far focused on the front of the laser device, which provides a laser beam to a system or device making use of the output laser light from facet 16. As illustrated in FIG. 1B, the distance p between the rear laser mirror 18 and the rear chip edge 88 can be made large since there are usually no stringent requirements for the optical beam quality any laser radiation emerging from the back mirror, or else the device is designed so that no significant radiation emerges from the back end.

Figure 1D:
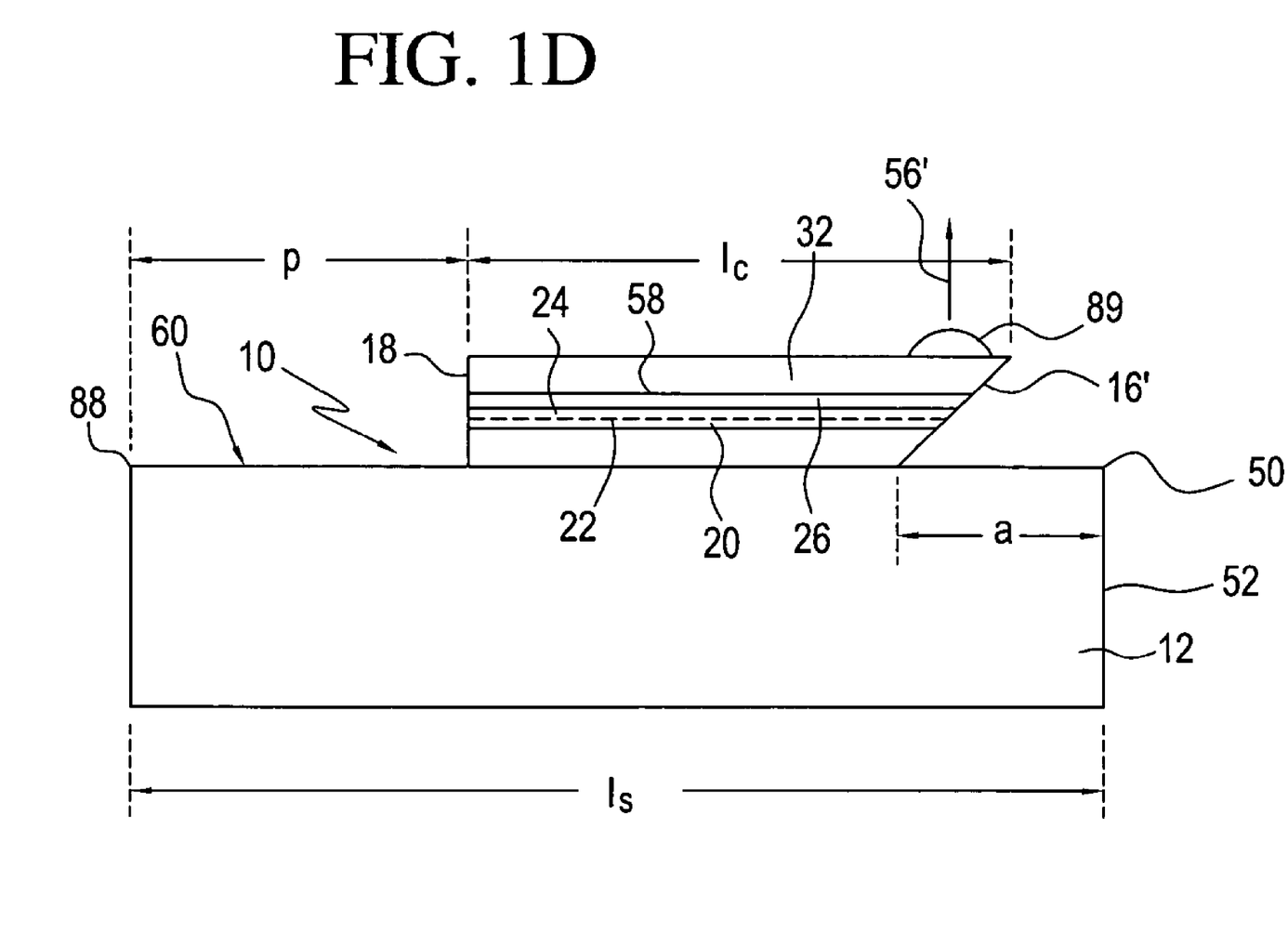
FIG. 1D illustrates a singulated ridge-type semiconductor laser with an etched facet at 45° to the plane of the substrate.

In the embodiments of the invention described above, the laser front mirror 16 is formed by etching the facet surface in a direction that is essentially perpendicular to the lasing direction, with the lasing direction being essentially parallel to the plane of the substrate wafer. However, as illustrated in FIG. 1D, surface emitting lasers can be formed by providing an angled etched front facet 16', which directs the emitted light 56' from the laser in a direction perpendicular to the plane of the substrate. Such laser structures are referred to as horizontal-cavity-surface-emitting-lasers or HCSELs. In the case of the HCSEL, the beam shape of the emerging radiation 56' is no longer impacted by singulation and the distance a is not as critical as that described above. If desired, a lens 89 may be provided above the top surface of the laser, as described in copending U.S. application Ser. No. 10/963,739, filed Oct. 14, 2004, and application Ser. No. 11/037,334, filed Jan. 19, 2005, both of which are assigned to the assignee of the present application.

As discussed above and illustrated in FIGS. 1A and B, the etching of the laser mirrors permits fabrication of short waveguide lengths $l_c$, and the chip length $l_s$ can be selected independently of $l_c$. In order to reduce cost, it is advantageous to reduce the chip length $l_s$ and width $b_s$ as much as possible while choosing dimensions large enough to keep handling difficulties during singulation, bonding and packaging at tolerable levels.

Figure 7:
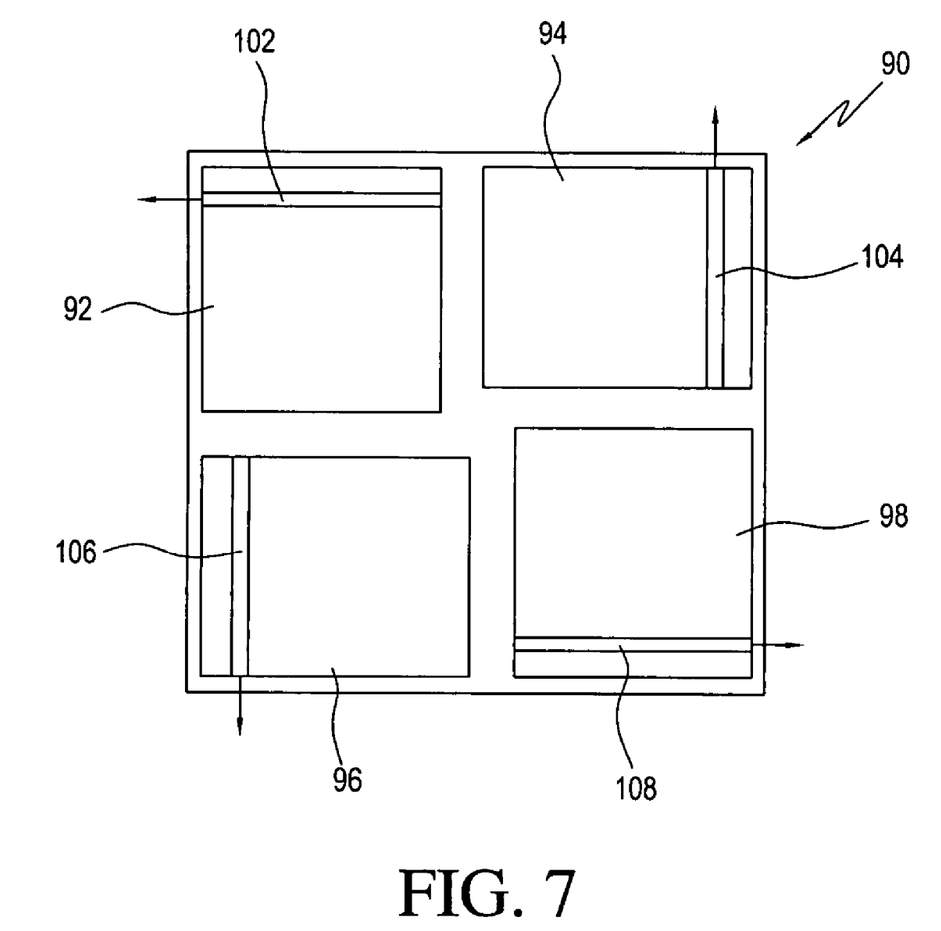
FIG. 7 illustrates four edge-emitting lasers fabricated on one chip.

In another embodiment of this invention, the waveguide length $l_c$ and laser mesa width $b_m$ can be chosen so that several lasers can be placed on one chip of dimensions $l_s$ and $b_s$. When etching is used for formation of the laser mirrors, the functionality and characteristics of each laser can be tested prior to chip separation, wire bonding and packaging. This allows determination and selection of the laser with the most favorable properties for a specific targeted application. The fabrication of redundant lasers on each designated device chip permits beneficial yield improvements and performance optimization. Lasers can be edge emitters with perpendicularly etched facets or can emit vertically using a HCSEL structure. While it is understood that several redundant lasers can be placed on a chip in a number of different geometrical arrangements and emission directions, FIG. 7 illustrates an example of a chip 90 having four redundant edge emitting devices 92, 94, 96 and 98. As illustrated in FIG. 7, the waveguide cavities 102, 104, 106 and 108, respectively, of each individual laser device is less than half of the chip length or width. In order to enhance yield, these several lasers are placed on a single chip 90, with the four lasers depicted in FIG. 7 emitting light in different directions. Such a chip is packaged into, for example, a TO-type can and one of the lasers can be selectively wirebonded inside the package to provide electrical current to the laser.

As is known, some freestanding GaN substrates have bands of low defect density GaN adjacent to bands of high defect density material. Laser cavities fabricated through cleaving are placed parallel to and within the low-defect-density bands. Short-cavity etched facet lasers can be fabricated at any arbitrary angle to the low defect density bands and can have their entire active region contained within the low defect density region.

An advantage of etched facet lasers is that coatings can be applied to the front and back laser mirrors to modify their reflectivity.

Figure 8:
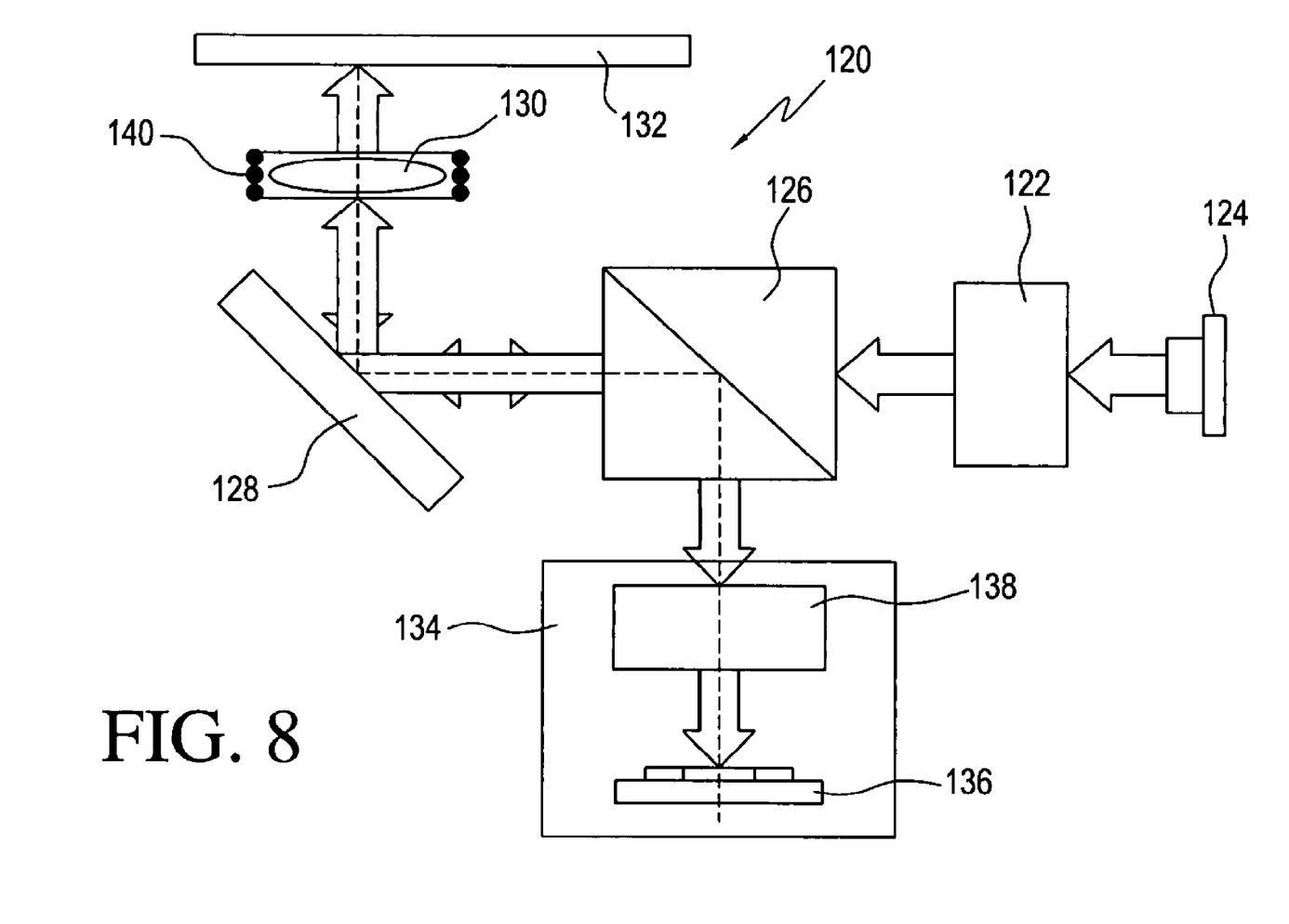
FIG. 8 illustrates an optical pickup system comprising an InGaAlN laser.

One application of the low-cost InGaAlN lasers of the present invention is in optical pickup devices used for optical data storage systems. While it is understood that such optical pickup devices and data storage systems can vary in the details of their design, FIG. 8 illustrates the typical components and functions of a pickup device generally indicated at 120. In this device, an optical beam shaping system 122 collects and shapes the radiation emitted by laser 124. Shaping components and functions can include a lens for collimation, a prism for circularization of the elliptical laser beam shape and a grating for producing two sidebeams adjacent left and right to the main beam. The laser light then passes through a beam splitter 126 which may be a polarizing beam splitter followed by a quarter waveplate. A mirror 128 directs the light to an objective lens 130, which focuses the light onto a storage medium 132.

The light reflected from the medium returns through lens 130, is reflected off mirror 128 and is diverted by beamsplitter 126 to a detection system 134. The detection system 134 comprises a photodetector 136 which is divided into multiple light-sensitive elements of a geometrical size and arrangement so that it produces electrical signals indicative of the data encoded on the storage medium and servo error signals indicative of the lateral data tracking and vertical focus position of the focused laser spot relative to the data. An optical processing system 138 may be used to optically manipulate the light so that the data and servo error signals are generated by photodetector 136.

An actuator system 140, typically of electromechanical design, is used to control the vertical and lateral position of the focused laser spot on the storage medium in response to the tracking and focus servo error signals.

Figure 9:
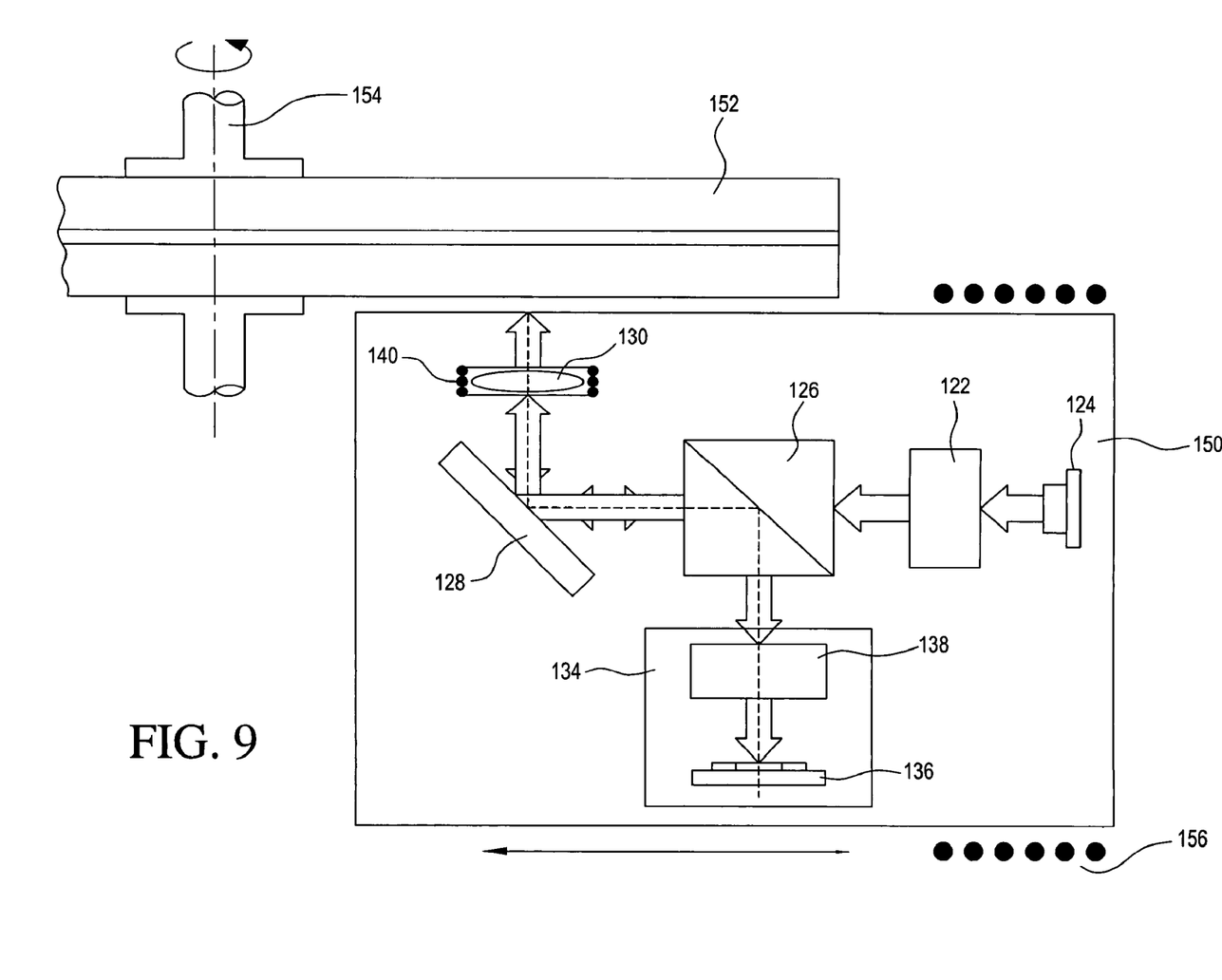
FIG. 9 illustrates an optical storage system comprising an optical pickup system and an InGaAlN laser.

FIG. 9 illustrates an optical storage system using an optical pickup device 150 with laser 124 and an optical disk medium 152, which is rotated by a motor 154. Data is encoded as an optically detectable material modification of the storage medium and arranged on circumferentially oriented tracks around the disk medium. Each data track can be accessed with the optical pickup 150 by using an electromechanical actuator system 156 to move and control the lateral position of the focused laser spot. The optical data storage system can be a read-only system that reads back data patterns that have been pre-recorded on optical disks with a separate system. The optical data storage system may also include the ability of writing data onto a disk medium using the laser 124 and an electrical controller for modulating the laser intensity.

Although the present invention has been illustrated in terms of preferred embodiments, it will be understood that variations and modifications may be made without departing from the scope thereof as set out in the following claims.

What is claimed is:

1. A laser, comprising:
a substrate having at least one predetermined region of low defect density and at least one predetermined region of high defect density, said low and high defect density regions being in parallel bands;
an InGaAlN-based laser cavity formed on said substrate at an angle other than parallel to said bands, said laser cavity including:
a lower cladding layer;
an active region;
an upper cladding layer; and
at least one etched facet, said etched facet including a lithographically-defined coating for reflectivity modification of said etched facet.

2. The laser of claim 1, wherein said cavity has a length $l_c$ and a width $w_l$, where $l_c < 1000$ μm and $w_l \leq 4$ μm.

3. The laser of claim 1, wherein said cavity has a length $l_c$, where $l_c \leq 400$ μm.

4. The laser of claim 3, wherein $l_c \leq 300$ μm.

5. The laser of claim 4, wherein $l_c \leq 200$ μm.

6. The laser of claim 5, wherein $l_c \leq 100$ μm.

7. The laser of claim 1, further including a second laser facet formed by etching a surface essentially perpendicular to the substrate plane.

8. The laser of claim 1, wherein said substrate comprises GaN.

9. The laser of claim 1, wherein said etched facet is essentially perpendicular to the substrate plane.

10. The laser of claim 9, further including a second laser facet formed by etching an angled surface at or near a 45° angle to the substrate plane.

11. The laser of claim 10, wherein said laser is incorporated in an optical storage system comprising:
an optical transmitter and shaper for directing and focusing radiation from said laser onto an optical storage medium;
an optical receiver for receiving reflected laser light from the optical storage medium and providing a data signal responsive thereto and position error signals indicative of the vertical and lateral position of the focused laser light relative to the data on said storage medium; and
an actuator for controlling the position of said focused laser light in response to said position error signals.

12. The laser of claim 11, wherein said optical storage system further comprises:
an optical storage disk medium with a plurality of data tracks circumferentially oriented around the disk medium;
a controller for the laser intensity; and
an electronic reading of said data signal.

13. The laser of claim 10, further including a lens formed above said 45° angled surface.

14. The laser of claim 10, further including a grating positioned above said 45° surface for splitting the received laser light into a central beam and at least two sidebeams adjacent to said central beam.

15. A photonic device, comprising:
a substrate having at least one predetermined region of low defect density and at least one predetermined region of high defect density, said low and high defect density regions being in parallel bands;
an InGaAlN-based waveguide cavity formed on said substrate at an angle other than parallel to said bands, said photonic device including:
a lower cladding layer;
an active region completely contained within said low defect density region;
an upper cladding layer; and
at least one etched facet, said etched facet including a lithographically-defined coating for reflectivity modification of said etched facet.

16. The photonic device of claim 15, wherein said etched facet is at or near a 45° angle to the substrate.

17. The photonic device of claim 16, further including a lens formed above said 45° facet.

18. The photonic device of claim 15, wherein said substrate comprises GaN.

* * * * *